United States Patent [19]

Carteau et al.

[11] Patent Number: 5,506,750

[45] Date of Patent: Apr. 9, 1996

[54] MASS MEMORY SUBSYSTEM HAVING PLATES WITH PLURALITIES OF DISK DRIVES CONNECTED TO CENTRAL ELECTRONIC CARDS

[75] Inventors: Daniel Carteau, Montigny le Bretonneux; Gilbert Michaud, Maule, both of France

[73] Assignee: Bull S.A., Paris, France

[21] Appl. No.: 231,103

[22] Filed: Apr. 22, 1994

[30] Foreign Application Priority Data

Apr. 22, 1993 [FR] France ................................. 93 04772

[51] Int. Cl.$^6$ ................................. G06F 1/16; H05K 7/10
[52] U.S. Cl. ........................... 361/685; 439/157; 361/726
[58] Field of Search .......... 364/708.1; 360/97.01–98.08, 360/137; 361/685, 725–727; 439/157

[56] References Cited

U.S. PATENT DOCUMENTS 5,173,819  12/1992  Takahashi et al. .................... 360/97.03

FOREIGN PATENT DOCUMENTS

| 0356977 | 3/1990 | European Pat. Off. . |
| 0421847 | 4/1991 | European Pat. Off. . |
| 0442642 | 8/1991 | European Pat. Off. . |
| 0488679 | 6/1992 | European Pat. Off. . |
| 88-06780 | 9/1988 | WIPO . |

Primary Examiner—Michael W. Phillips
Attorney, Agent, or Firm—Kerkam, Stowell, Kondracki & Clarke; Edward J. Kondracki

[57] ABSTRACT

An apparatus (T) for housing a mass memory subsystem ($SSM_1$–$SSM_3$) that is connected to at least one host system ($H_1$, $H_2$) is provided. The apparatus includes a plurality of compartments, each compartment receiving at least one of a plurality of groups of disk units (101–112, 201–212, ..., 601–612); at least one electrical supply unit for supplying electrical power to the disk units; a plurality of plates (P1–P6) having a central portion about which the compartments are arranged. The compartments carry the disk units. The central portion includes an electronic card to which the disk units are connected. The electronic card provides real-time management of disk units and connection of the disk units to the host system. The apparatus has a front portion (PAV) adapted to house the plurality of plates that are slidably insertable into the front portion and are arranged parallel to each other. A rear portion (PAR) of the apparatus includes an electrical power supply and a backpanel connected to each of the electronic cards of the plates by connectors disposed in a predetermined configuration on the backpanel. The configuration of the connectors is based on the configuration of the specific subsystem being housed in the apparatus.

12 Claims, 14 Drawing Sheets

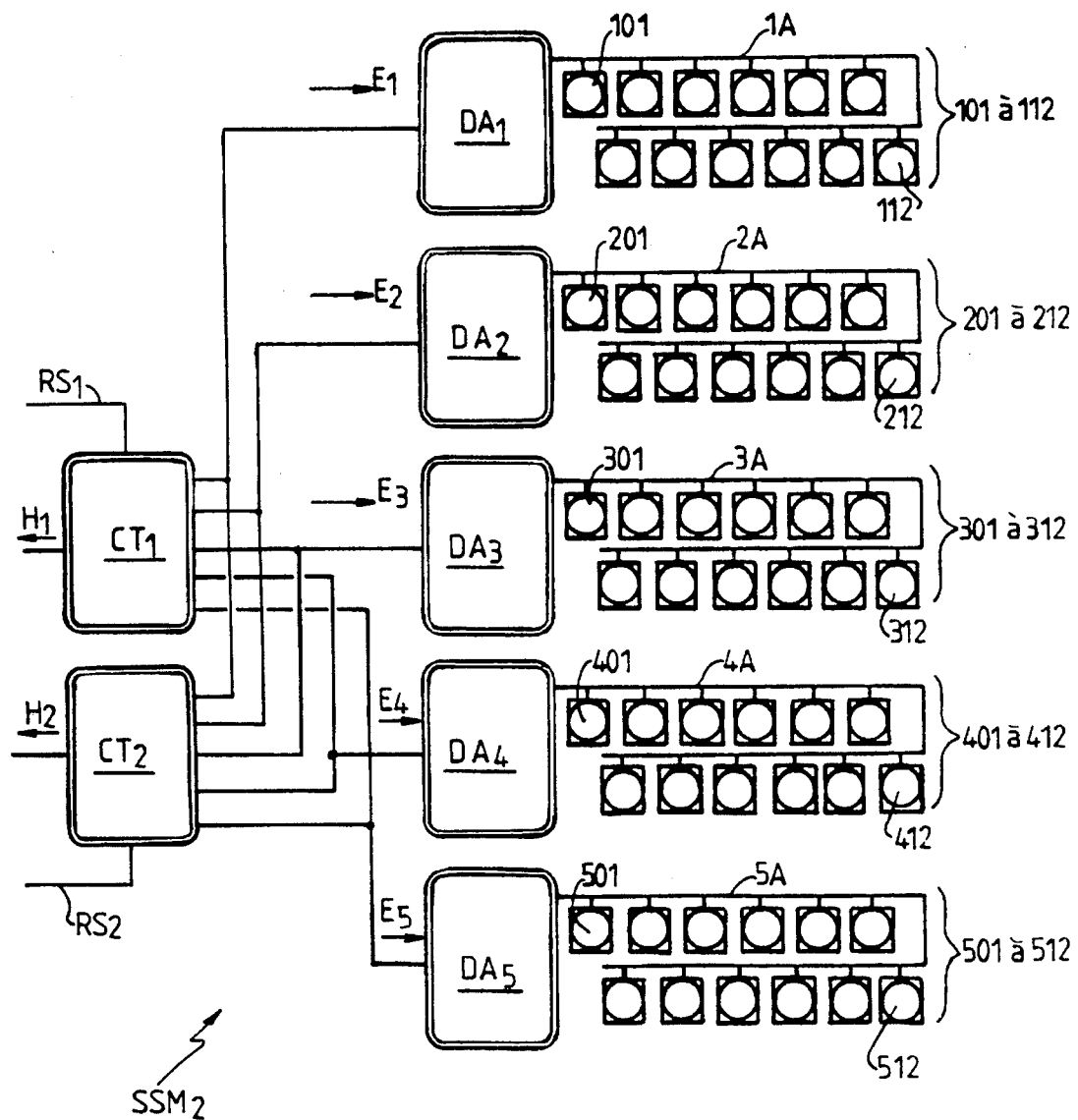
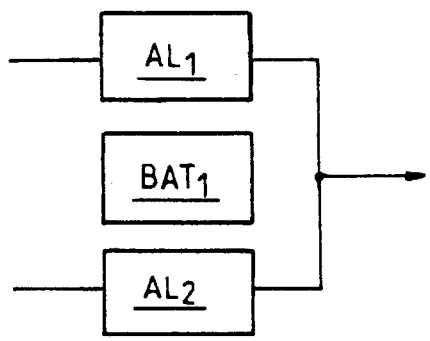
FIG.2

5,506,750

MASS MEMORY SUBSYSTEM HAVING PLATES WITH PLURALITIES OF DISK DRIVES CONNECTED TO CENTRAL ELECTRONIC CARDS

FIELD OF THE INVENTION

The present invention relates to a physical structure of a mass memory subsystem. It is applicable to any type of information processing system.

BACKGROUND OF THE INVENTION

Modern information processing systems are becoming increasingly complex. They are composed of a central system, occupying a predetermined geographical position, around which secondary systems, located at different geographical regions from that occupied by the central system, gravitate. The structure of a system, whether it is central or secondary, is generally made up of at least one central unit, also called a host, connected to various peripherals, which include mass magnetic memories, such as, for example, rotating disk memories. The role of these mass magnetic memories, in particular disk memories, is to store the information intended to be processed with the information processing system overall, i.e., the system composed of central and secondary systems, when a user located at any geographical place requests it to do so.

Rotary magnetic disk memories have for a long time remained widely used, because they make it possible to store very large quantities of information and access it relatively rapidly. Furthermore, technological progress, particularly in the field of magnetic recording media and recording heads, has made it possible to make disk memories with capacities on the order of half a gigabyte, in increasingly reduced physical volumes. Currently, disk memories have been developed whose disk diameter is on the order of 2.5 inches. It may be imagined that in the coming years, the capacity of such memories, whose physical dimension is on the order of the size of a package of cigarettes, may achieve 1 gigabyte.

Information processing systems process very large volumes of data which requires the use of an ever increasing number of mass memories in which these data must be stored before being processed by the central processors thereof.

As a result, management of such systems by a single central unit is extremely tedious.

Accordingly, one is lead to decentralizing management among a plurality of subsystems, each managing one portion of the elements of the system, in particular the peripherals.

To do so, mass memory peripheral subsystems, instead of the central unit, manage not only the transfer of data from the central unit to the mass memories but also the reading and writing of information within these mass memories.

FIGS. 1-3 show exemplary embodiments of such systems.

Turning first to FIG. 1:

The subsystem $SSM_1$ includes from one to five identical assemblies $E_1-E_5$.

The assembly $E_1$ is composed of an adapter device $DA_1$, which is tasked with connecting a set of a maximum of 12 disk memories, i.e., disk memories 101–112, to one or more hosts $H_1, \ldots, H_n$. The twelve memories are connected to one another by the same linking chain 1A. The system of connecting the disk memories over the link 1A is such that if one of them is disconnected, all the others continue to function.

The assemblies $E_2-E_5$ have a structure identical to the assembly $E_1$. Hence the assembly $E_2$ is composed of an adapter device $DA_2$ and 12 disk memories 201–212, connected to the same linking chain 2A. The same is true for the other assemblies $E_3-E_5$, the latter being composed of an adapter device $DA_5$ associated with 12 disk memories 501–512 connected to the same chain 5A.

Hence to assure maximum operating reliability of the assemblies $E_1-E_5$, two identical power supplies $AL_1$ and $AL_2$ and a backup battery $BAT_1$ are associated with the subsystem $SSM_1$. This means that if one of the two power supplies $AL_1$ and $AL_2$ fails, the other replaces it, or that if the sector power supply is broken, then the battery $BAT_1$ continues to assure the electrical supply to each of the subassemblies $E_1-E_5$ for a predetermined, programmable period of time.

This power supply redundancy and the battery backup are generally optional but are required when disk memories function in the known "fast write" mode. One example of the fast write mode is given in French Patent Application 89 1711, filed by the present applicant on Dec. 22, 1989. $SSM_1$ includes a fast write processor FWP, which continuously oversees the operating state of $AL_1$, $AL_2$, $BAT_1$ and depending on this state either does or does not authorize the "fast write" mode or the normal writing mode.

Turning to FIG. 2, a second mass memory subsystem $SSM_2$ of the standard RAID (a commonly used acronym for Redundant Array of Inexpensive Disks) type is shown.

This system includes a first controller $CT_1$, connected to at least one central host H1 (or to host $H_1, \ldots, H_n$) and a second controller $CT_2$ connected to at least one central host $H_2$ (or hosts $H_1, \ldots, H_n$). The controller $CT_1$ may also be connected via an RS-232-type link to a maintenance/configuration console or to a modem, while the second controller $CT_2$ is connected via an RS-232 link of the same type as the foregoing to a maintenance/configuration console or to a modem. It will be recalled that the RS-232-type link is standardized. Each of the two controllers $CT_1$ and $CT_2$ is connected to five assemblies $E_1-E_5$, which are identical to the assemblies $E_1-E_5$ of FIG. 1. The role of the adapter devices $DA_1-DA_5$ is identical to that of the adapter devices in FIG. 1. It is, therefore, evident that the system $SSM_2$ is redundant, which means that if one of the two controllers fails, the second will support the entire task of the subsystem. As in FIG. 1, the subsystem $SSM_2$ includes two power supplies $AL_1$ and $AL_2$ as well as a backup battery $BAT_1$. It is also clear that the subsystem $SSM_2$ is a protected system that is reliable because of the redundant architecture, the doubling of the power supplies, and the possibility (thanks to the RAID function) of changing any of the disk memories of any of the assemblies $E_1-E_5$ without interrupting the function of the others. In other words, the subsystem $SSM_2$ has total availability.

Turning now to FIG. 3, a third example of a mass memory RAID subsystem is shown, that is, $SSM_3$, whose novel structure is proposed by the present applicant. This subsystem includes two host adapters $HA_1$ and $HA_2$, which are connected to two central hosts $H_1$ and $H_2$ (or more central hosts $H_1, \ldots, H_n$), whose role is to manage the exchange of data between one of the two central hosts $H_1$ and $H_2$ and all the adapter devices of the subsystem. Each of these host adapters is connected in the following manner to six subassemblies $E_1-E_6$, which are completely identical in their mechanical structure to the assemblies of the same name in FIGS. 1 and 2. The first assembly $E_1$ is composed of the adapter device $DA_1$ associated with the disk memories 101–112 connected to the linking chain 1A, and so forth, up to the assembly E6, composed of the adapter device $DA_6$ associated with disk memories 601–612 connected to the linking chain 6A. The structure that connects the host adapters $HA_1$ and $HA_2$ to the six subassemblies $E_1$ to $E_6$ is a ring structure. This ring is identified by the symbol AN. Thus the first host adapter $HA_1$ is connected on the one hand, by way of the link $L_1$ to the device $DA_1$ of the assembly $E_1$. $DA_1$ is connected by the link $L_2$ to $DA_2$, which is connected by the link $L_3$ to the adapter device $DA_3$, which in turn is connected by the link $L_5$ to the second host adapter $HA_2$. The first host adapter $HA_1$ is also connected by the link $L_4$ to the adapter device $DA_4$ of the assembly $E_4$. $DA_4$ is in turn connected by the link $L_6$ to the adapter device $DA_5$, which in turn is connected by the link $L_7$ to the adapter device $DA_6$ of the assembly $EA_6$. This last adapter device is connected by the link $L_8$ to the second host adapter $HA_2$. It is thus seen that a ring structure AN is again achieved that connects the two host adapters $HA_1$ and $HA_2$ to the various adapter devices $DA_1$ to $DA_6$. As in subsystems $SSM_1$ and $SSM_2$, subsystem $SSM_3$ includes two electrical power supplies $AL_1$ and $AL_2$, associated with a backup battery $BAT_1$. The subsystem $SSM_3$ has the same advantages as the subsystem $SSM_2$ in terms of availability and backup protection of the data. However, it has much greater power and sophistication.

SUMMARY OF THE INVENTION

The present invention relates to an extremely compact physical structure in the form of a drawer including a plurality of plates, which can contain one or the other of the three subsystems shown in FIGS. 1–3, with the ability to change from one type of system to another, for the same drawer at the same location where that drawer is located (this property is known to one skilled in the art by the term "upgradability"). To upgrade the system all that has to be changed is a backpanel that includes the drawer. Moreover, this physical structure enables very high availability of the mass memory subsystem, thanks to the reduced number of elements, the nonpropagation of failures, and redundancy. In addition, any disk unit can be replaced without interrupting the function of the subsystem (when in the RAID, $SSM_2$, $SSM_3$ mode), and the majority of the elements of the assembly in operation can be changed without stopping operation (nonstop operation).

According to the invention, the physical structure of a mass memory subsystem connected to at least one host system is provided, comprising: a drawer, a plurality of groups of disk units (101–112, 201–212, . . . , 601–612); at least one electrical supply unit for supplying electrical power to said disk units; a plurality of plates (P1–P6) slidably insertable within said drawer and having a central portion about which a plurality of compartments are disposed, said compartments carrying said disk units, said central portion comprising an electronic card to which said disk units are connected, said electronic card providing at least one of real-time management of disk units and connection of the disk units to said host system; a front portion (PAV) of the drawer adapted to house said plurality of plates, wherein said plurality of plates are slidably insertable into said front portion and are arranged parallel to each other; a rear portion (PAR) of the drawer comprising an electrical power supply; and a backpanel connected to each of the electronic cards of said plurality of plates by connection means disposed in a predetermined configuration on said backpanel, said predetermined configuration being based on a specific subsystem being housed in said apparatus.

BRIEF DESCRIPTION OF THE DRAWINGS

Further characteristics and advantages of the present invention will become apparent from the ensuing description, given by way of nonlimiting example, in conjunction with the accompanying drawings. In these drawings:

FIGS. 1–3 show three examples of mass memory subsystems that may be contained in the physical structure according to the invention;

DETAILED DESCRIPTION OF PREFERRED EMBODIMENTS

The description now turns to FIGS. 4, 7, 8, 11a, and 11b.

As can be seen from these drawing figures, the physical structure SP of the invention includes a drawer T of parallelepiped shape, including, on each of its side walls, a plurality of longitudinal drawer slides parallel to one another and disposed above one another, i.e., the pair of slides G1–G'1, G2–G'2, and so forth up to G7–G'7.

Figure 7:
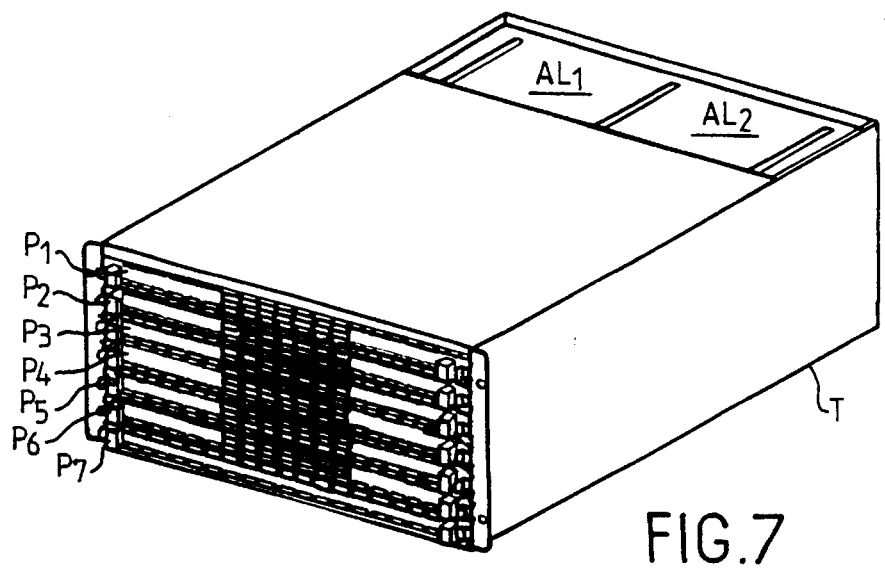
FIG. 7 is a perspective view of the drawer in its entirety, with the plates disposed inside it.

The structure SP also includes a plurality of plates P1, P2, . . . , P7, which are parallel to one another and relatively flat (each with a thickness on the order of 35 mm). Each of the plates P1–P7 has a rectangular parallelepiped form, and is capable of sliding inside the drawer T on the slides G1–G'1 through G7–G'7. The plate P1 can slide inside the drawer T on the slides G1–G'1, and so forth, up to the plate P7, which can slide on the slides G7–G'7. This manner of inserting the plates inside the drawer T is extremely practical and makes it possible to remove or insert any one of them at will, with great ease of manipulation. It can be seen that any of the plates P1–P7 can be inserted inside the drawer T by causing the plate in question to slide from front to back or from back to front, longitudinally, in the direction of the arrow $f_1$ parallel to the length of the drawer T. Once all the plates $P_1$–$P_7$ have been inserted, the global structure of the drawer T shown in FIG. 7 is achieved. The global structure is extremely compact and can be placed in either a horizontal position, as shown in FIG. 7, or a vertical position. In the vertical position, the drawer T is said to occupy a "desktop" position. This vertical disposition is currently used by microcomputer users. The plates $P_1$ through $P_7$ are introduced through the front portion of the drawer T, PAV, while the rear portion PAR is composed of two power supplies $AL_1$ and $AL_2$, each provided with a ventilation device $V_1$, $V_2$. These two power supply blocks, which are identical, are disposed side by side in this rear portion. The power supply blocks each have the form of a rectangular parallelepiped block.

Each of the plates $P_1$–$P_5$ (or $P_2$–$P_6$) carries a plurality of disk units, which may be either 10 or 12 in number at maximum (of the two types of plates shown in FIGS. 5 and 6, respectively, the first carries 12 disks and the second carries only 10 disks), or eight in the case of 3½" disks. If $P_1$ carries disk units, $P_6$ carries either the processor FWP ($SSM_1$) or $CT_1$–$CT_2$ ($SSM_2$), or vice versa. For the ensuing description it will be assumed that $P_1$ carries disk units.

The plate $P_7$ carries a set of backup batteries BAT.

The front part PAV and the rear portion PAR are separated by a backpanel FP, which carries a certain number of electrical connections and whose surface area is limited to allow the ventilation air to pass through (this service area is much less than the surface area of the rectangular cross section of T).

Figure 11B:
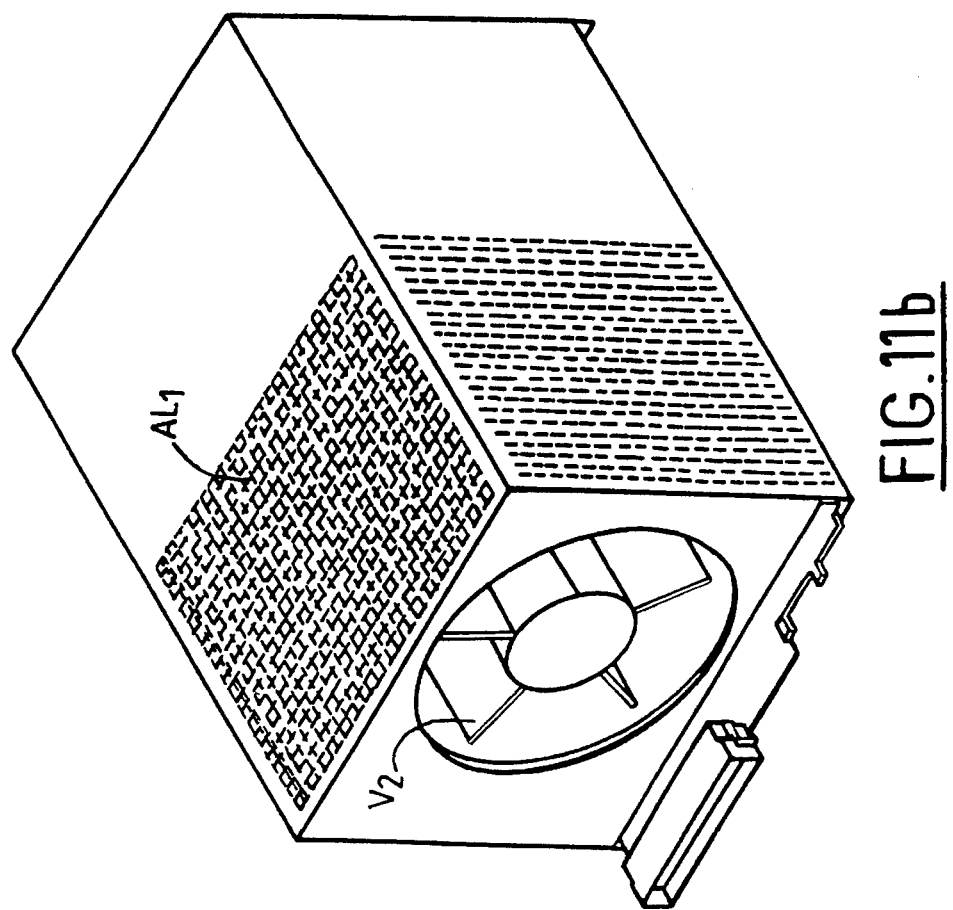
FIGS. 11a–11b show further detail of an electric power supply block of the physical structure of the invention.
Figure 11A:
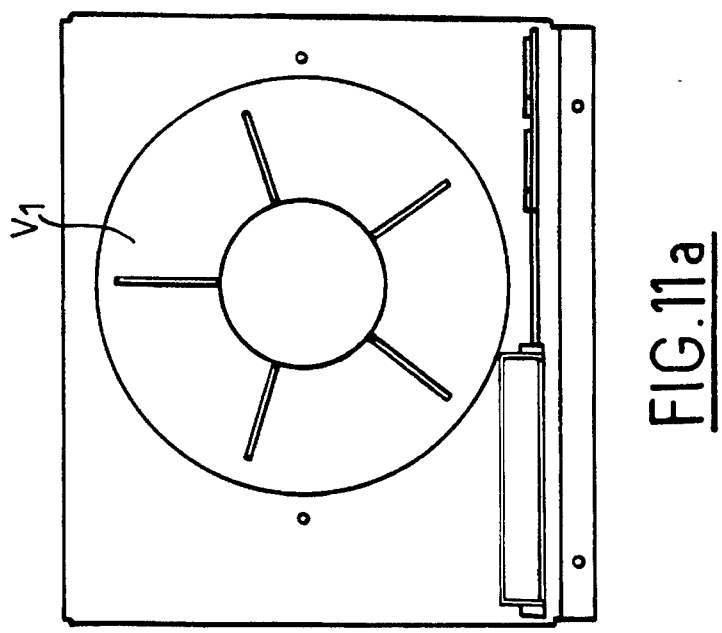

FIGS. 11a and 11b, both in its portion 11a and its portion 11b, show in detail the ventilation system disposed in the rear portion of the power supply block; this ventilation block is made up of a fan with five blades.

Figure 8:
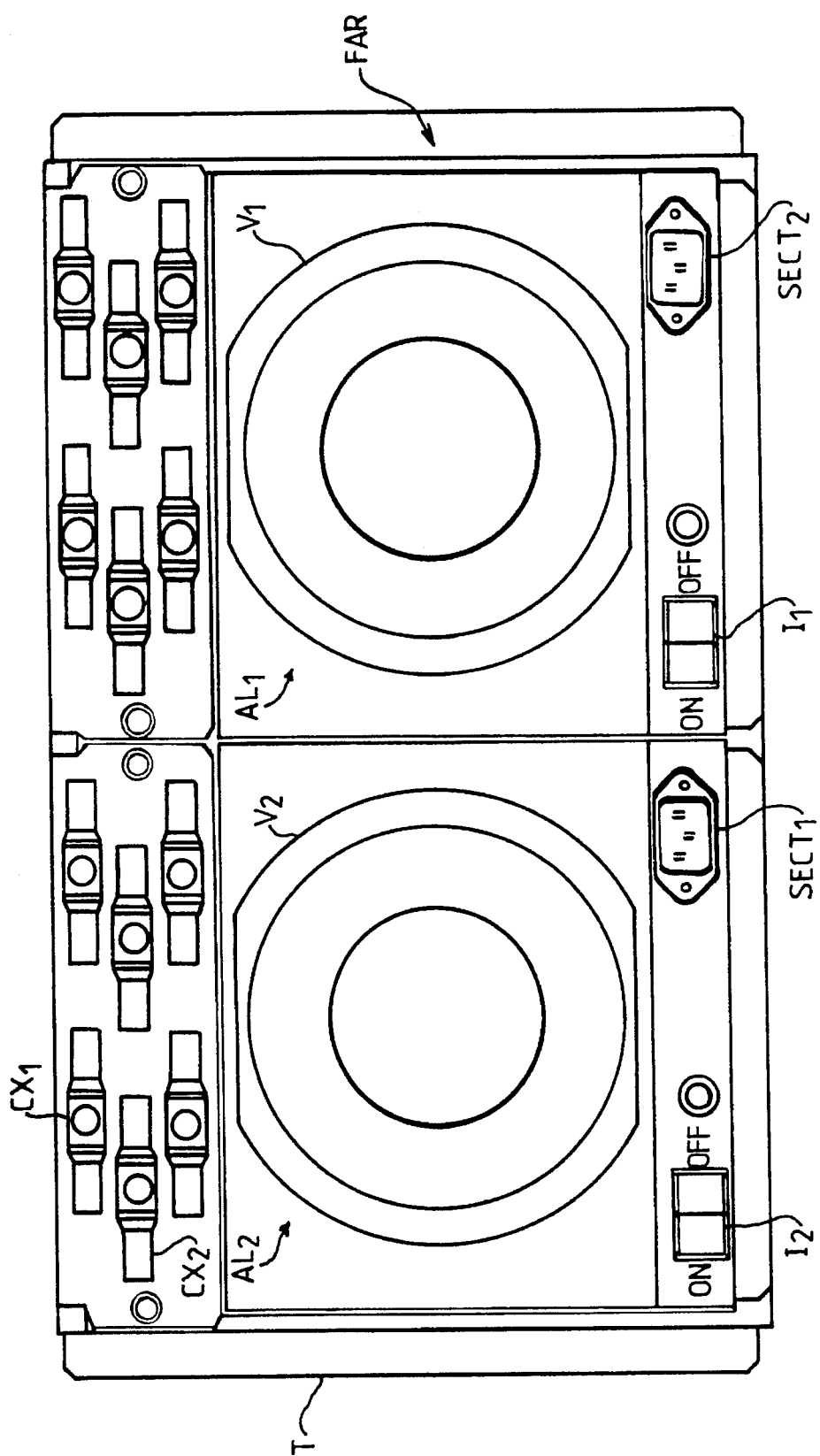
FIG. 8 is a front view of the rear portion of the physical structure of the invention.

The rear face FAR of the part PAR, which can be seen in FIG. 8, further includes two switches $I_1$ and $I_2$ intended for routing each of the respective power supply blocks $AL_1$ and $AL_2$, and two sector sockets $SECT_1$ and $SECT_2$, each located in the right-hand portion of a respective one of the two power supply blocks.

Figure 5:
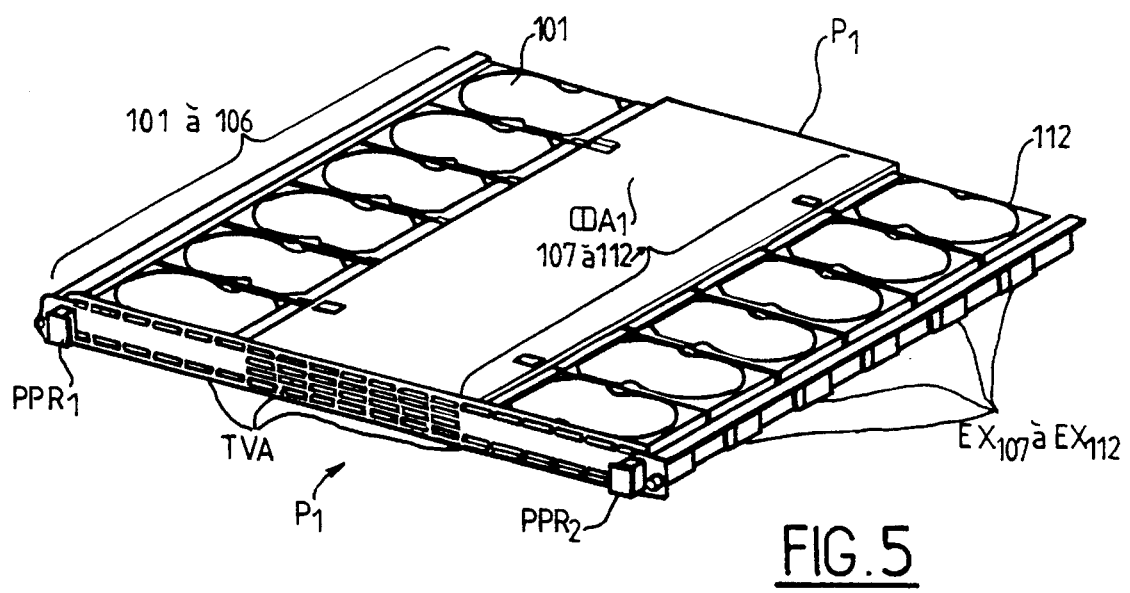
FIG. 5 is a perspective view, seen from the front, of a first model of a plate that carries a plurality of disk units.
Figure 6:
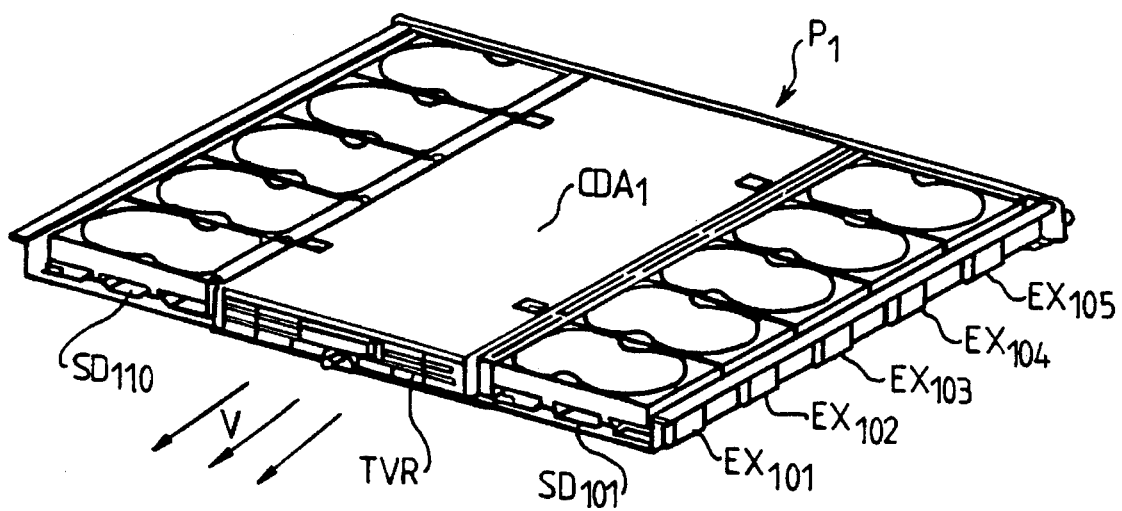
FIG. 6 is a view from behind of a second model of a plate carrying disk units.

Turning now to FIGS. 5 and 6, which show a view from the front and from the back of two exemplary embodiments of the plate $P_1$, respectively. In FIG. 5, $P_1$ carries 12 disk memories 101–112, while in FIG. 6, this same plate includes only 10 disk memories 101–110. As a result, the plate P1 includes two parallel rows of six disk memories (FIG. 5) or two parallel rows of five disk memories (FIG. 6), i.e., a first row of disk memories 101–106 (or 101–105) and a second row of disk memories 107–112 (or 106–110), respectively. As can be seen in these same drawing figures, these different disk memories are disposed side by side, with their longitudinal axes perpendicular to the longitudinal axis of the plates $P_1$.

Figure 1:
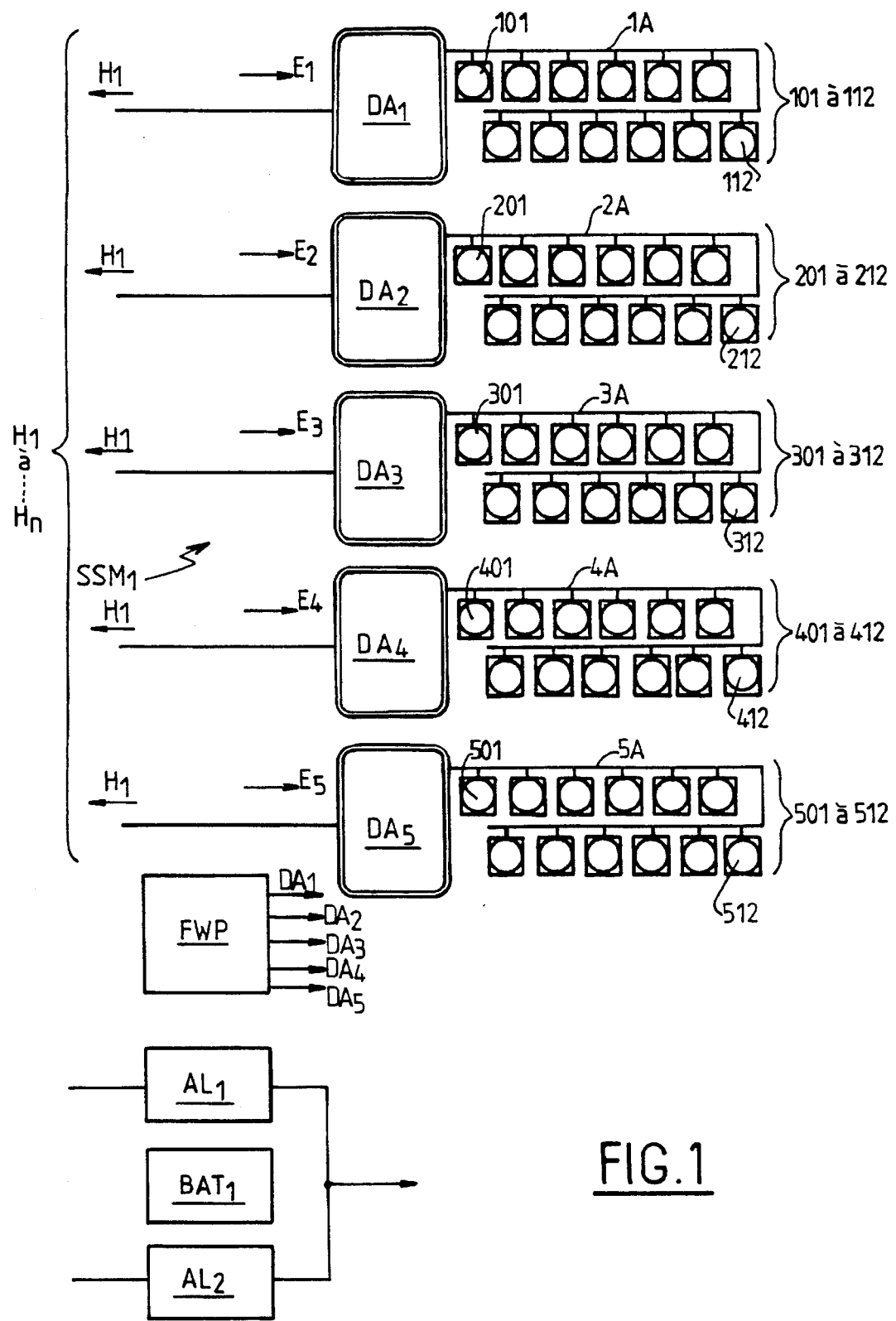
Figure 3:
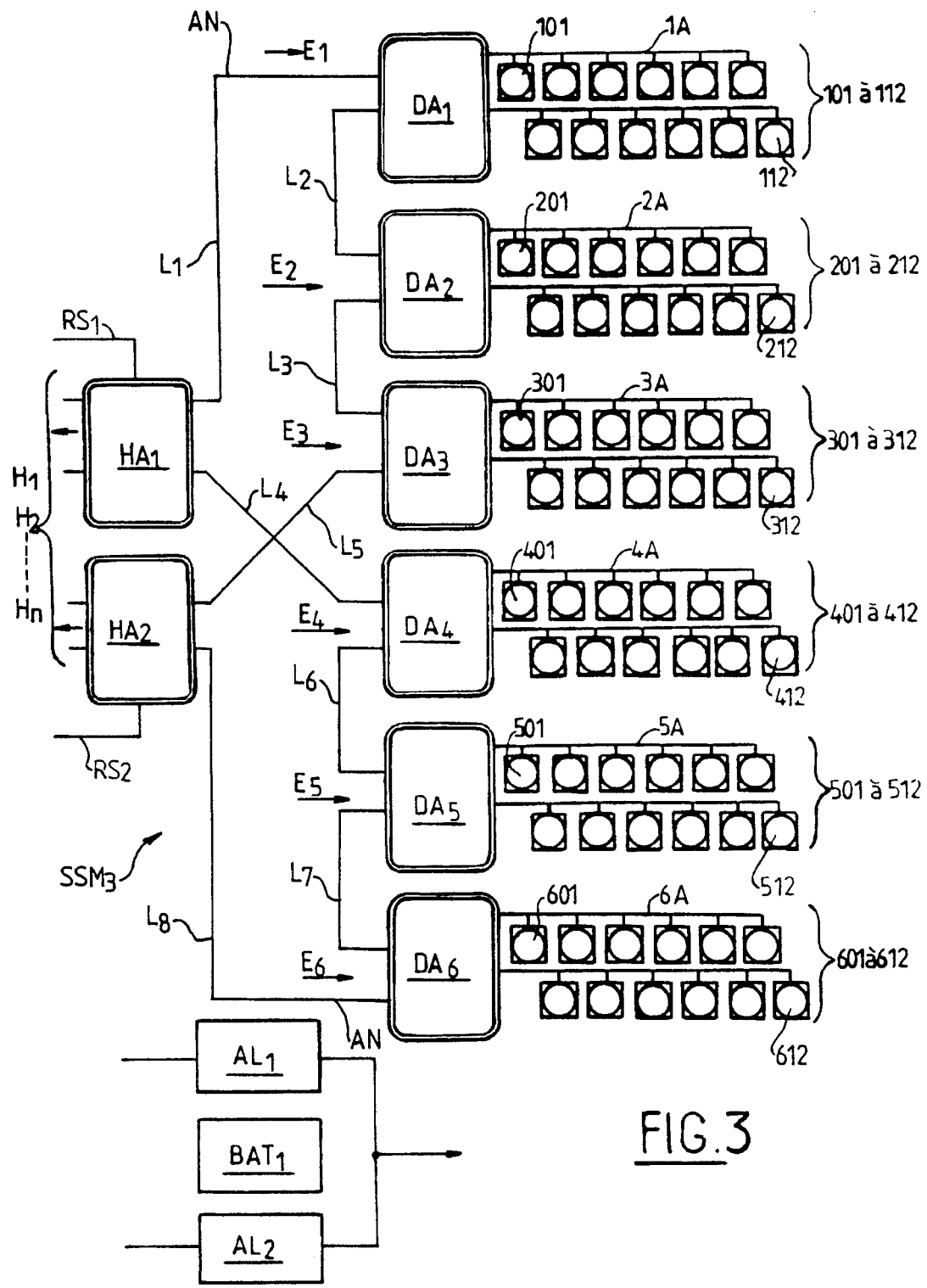
Figure 4:
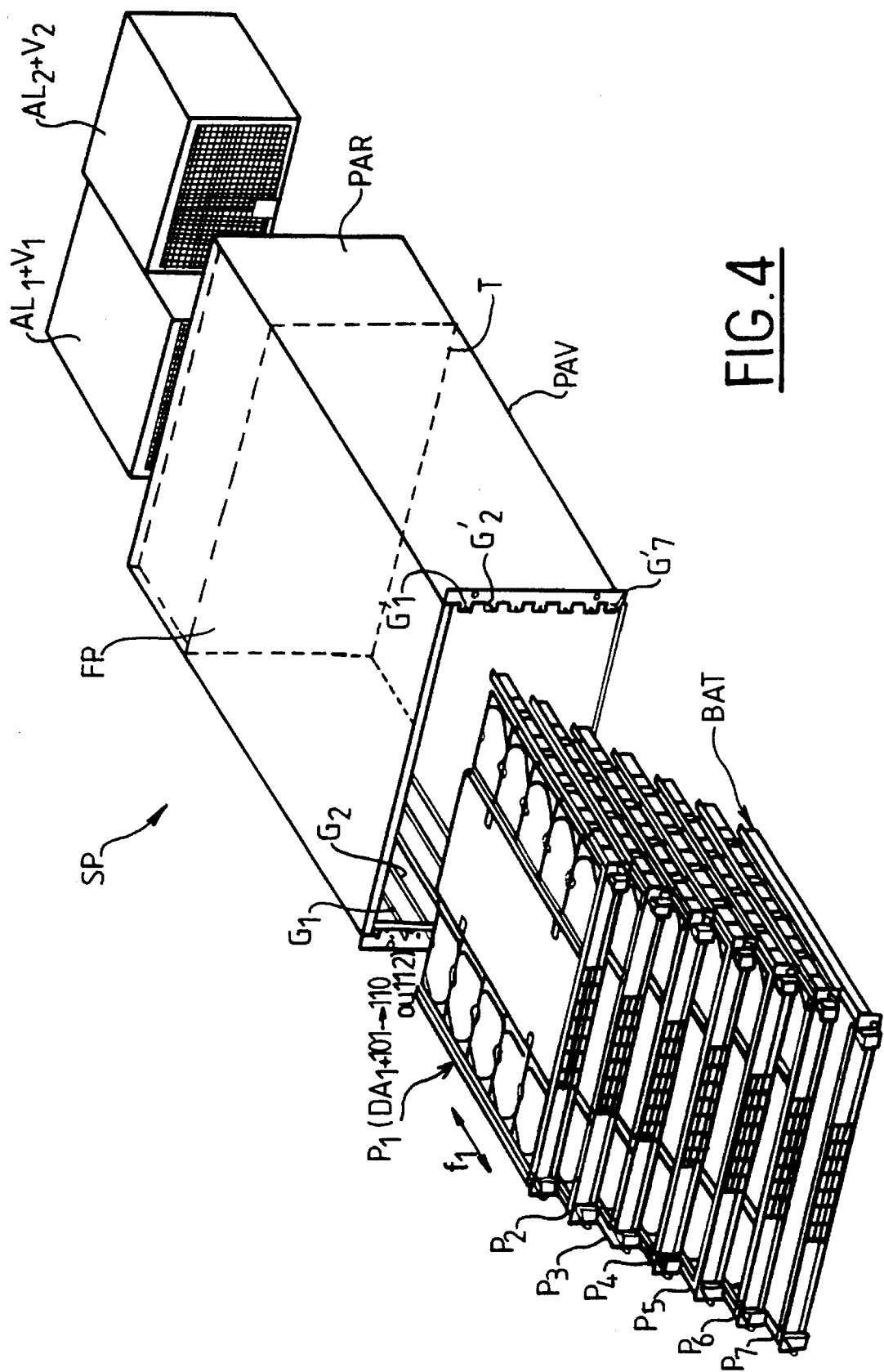
FIG. 4 is a perspective view showing the various essential constituent parts of the physical structure of the invention, that is, the set of plates, drawers and power supplies.

The plate $P_1$ includes a central portion carrying the electronic card $CDA_1$, carrying an adapter device $DA_1$, which may be any one of the adapter devices shown in FIGS. 1–3. The two rows of disks 101–106, 107–112 (or 101–105, 106–110) are disposed on either side of this central part $CDA_1$. The disk units (or for simplicity, hereinafter "disks" instead of "disk units") of the first row are all connected, in a manner to be described hereinafter, to the same side of the plate $CDA_1$. This plate is rectangular, and its longitudinal direction is the same as that of the drawer T. Similarly, the disks of the second row are connected to the plate $CDA_1$ on the same side of the card $CDA_1$, that is, the side opposite the side to which the disks of the first row are connected.

In its front portion, the plate $P_1$ includes two handles $PPR_1$ and $PPR_2$, enabling any operator to insert the plate in question inside the drawer T, or extract it therefrom, more easily. The first handle, $PPR_1$, is located toward the row of disks 101–106, toward the left-hand longitudinal edge of the plate P1, in FIG. 5, while the second handle $PPR_2$ is located toward the second row of disks 107–112, near the longitudinal edge of the plate $P_1$ located in the right-hand part of FIG. 5.

A series of removal levers is located on the longitudinal edges of the plate $P_1$, making it possible to insert or remove the disks into or from the row with which they are associated. These levers also make it possible to lock the disks of the row once they have been put in place on the plate $P_1$, there by connection of the disks to the central card $CDA_1$. Thus in FIG. 6, the removal levers $EX_{101}$–$EX_{105}$ can be seen from bottom to top in the right-hand part of the drawing figure, while in FIG. 5, the removal levers $EX_{107}$–$EX_{112}$ can be seen from bottom to top on the right in this drawing figure.

The levers $EX_{101}$–$EX_{105}$ are associated with the disks 101–105, respectively, while The levers $EX_{107}$–$EX_{112}$ are associated with the disks 107–112. It is clear that the same will be true for the levers that are not visible in FIGS. 5 and 6, that is, the levers $EX_{101}$–$EX_{106}$ on the one hand, and $EX_{106}$–$EX_{110}$ on the other, associated with the respective sets of memories 101–106 and 106–110. The way in which one proceeds to insert the disks into (or remove them from) the plate $P_1$ and lock them in such a way as to connect them to the plate $CDA_1$ will be explained hereinafter, in conjunction with FIGS. 12a–14b.

In FIGS. 5 and 6, in the center of the plate, respectively on the left edge and the rear edge thereof (those which are visible in the same drawing figures, respectively), a series of ventilation holes TVA and a series of ventilation holes TVR may be seen. These ventilation holes have a rectangular shape to enable the passage of the ventilation air V in the direction indicated by the arrows, these arrows being parallel to the length of the plate $P_1$, that is, to the length of the drawer T. The ventilation air V aspirated by the fans $V_1$ and $V_2$ is accordingly aimed from front to back in the direction of the length of the plates. It passes above and below the disks 101–106 and 107–112 (or 101–105 and 106–110).

Figure 9:
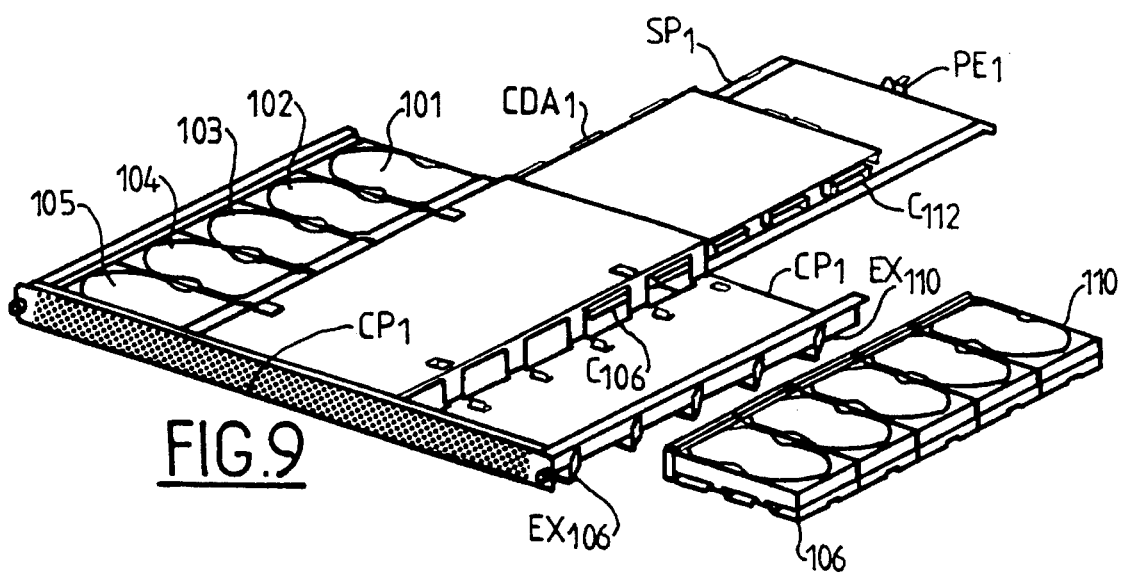
FIG. 9, in detail, is a perspective view from the front of the plate of FIG. 6, showing the various constituent portions thereof in greater detail.
Figure 10:
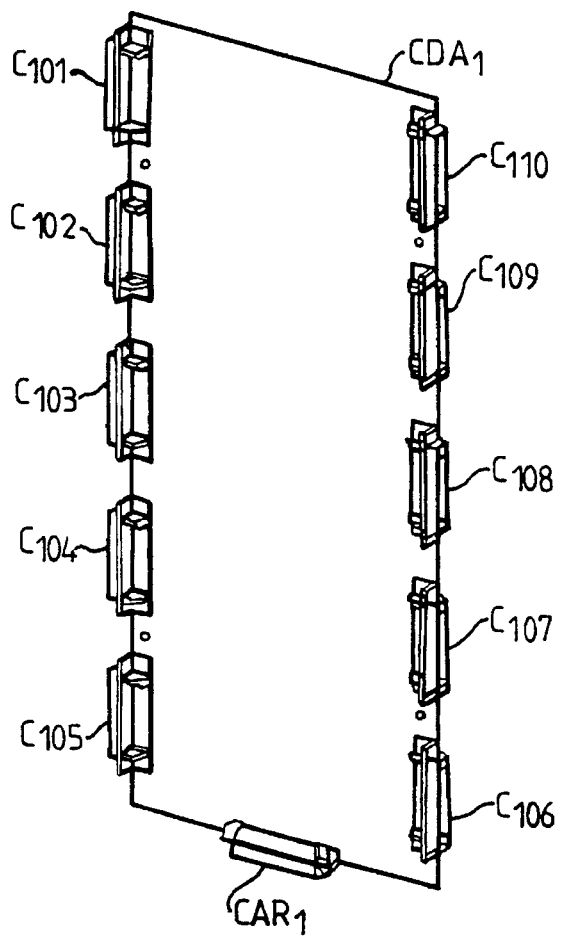
FIG. 10 is a perspective view of an electronic card carrying an adapter device that can be connected to a plurality of disk units belonging to the plate.

Turning now to FIGS. 9 and 10, these show in detail how the plate $P_1$ is embodied.

In FIG. 9, the memories 101–105 are shown inserted into the plate $P_1$, while the memories 106–110 are shown not inserted, outside $P_1$, in the right-hand part of the drawing. The levers $EX_{106}$–$EX_{110}$ have been shown on the right longitudinal edge of $P_1$, in the position that they occupy once the memories 106–110 have been removed from the plate $P_1$. In that position, which can be called the removal position, each of the levers in question forms a predetermined angle with the longitudinal edge of the plate, the angle being approximately 30° in FIG. 9. These levers can accordingly bring about an equal rotation by that angle, from a position in which they are pressed against the edge of the plate to the removal position, thanks to a hinge, not shown, around which they can pivot, this hinge being perpendicular to the plane of the plate $P_1$ (that is, vertical to FIG. 9).

In this same FIG. 9, the electronic card $CDA_1$ is shown in a part detached from the plate $P_1$, this card being disposed on a support $SP_1$. It can slide on this support from front to back or vice versa when one wishes to withdraw it from or insert it into it. This support includes a removal handle $PE_1$ in its rear portion, making it possible to withdraw the central portion of the plate $P_1$. (This is done for example before removing the electronic card $CDA_1$, for instance when it is necessary to change it.) This card $CDA_1$ is inserted under the cap $CP_1$ disposed in the upper portion of the plate in FIG. 9, in the center of the plate.

As can be seen in FIG. 10, $CDA_1$ includes a plurality of connectors on each of its two longitudinal edges, that is, the connectors $C_{101}$–$C_{105}$ on the left-hand longitudinal edge, and $C_{106}$–$C_{110}$ on the right-hand longitudinal edge. It is quite clear that the card $CDA_1$ may contain 2×6 connectors, as well i.e., $C_{101}$–$C_{106}$ on its left edge and $C_{107}$–$C_{112}$ on its right edge, if the plate $P_1$ contains 12 disks instead of the 10 disks shown in FIG. 9. All the connectors $C_{101}$–$C_{110}$ are identical and correspond to the standard used for disk operation, in this case the SCSI Standard.

As can be seen in FIG. 10, both on the left side edge and the right side edge, the various connectors are spaced apart regularly. In addition, in the rear portion of the card $CDA_1$, or in other words the lower part of FIG. 10, this card contains a rear connector $CAR_1$ that enables connecting it to at least one external host system, by way of connections disposed in the rear part PAR of the drawer T. This will be illustrated more particularly in the later description in conjunction with FIG. 16.

The description now turns to FIGS. 12a–14b.

Figure 12B:
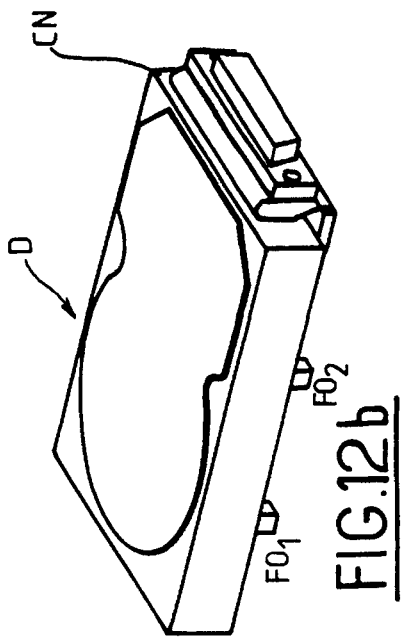
FIGS. 12a–12d show how a disk unit is mounted on its support.
Figure 12A:
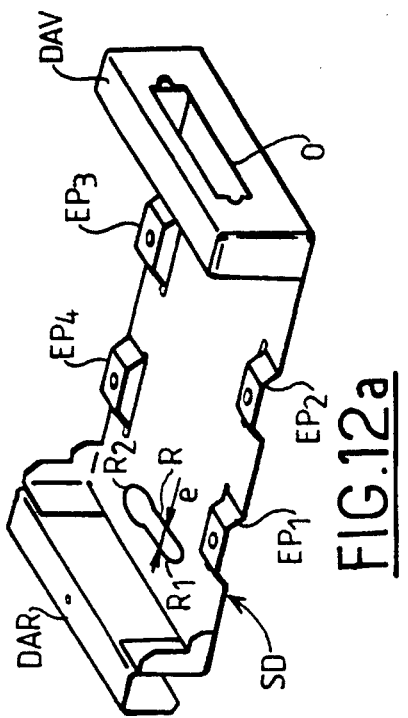
Figure 12D:
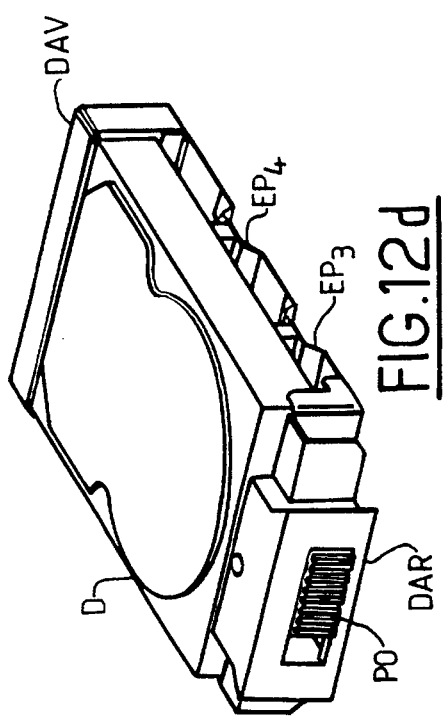
Figure 12C:
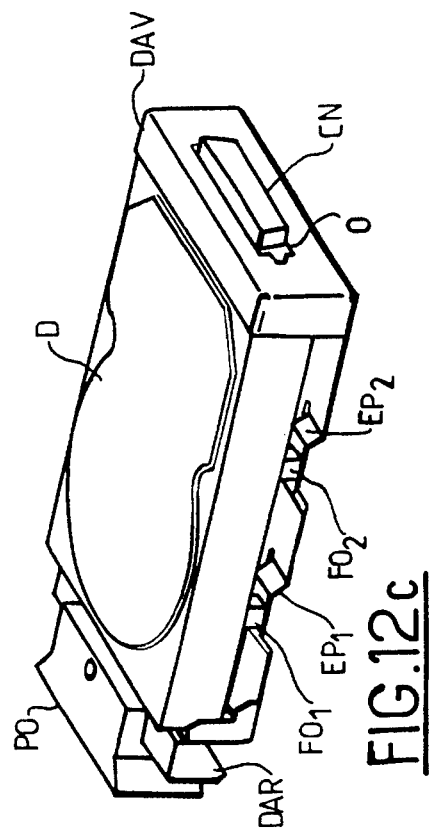

FIGS. 12b–12d show how a disk D is fixed on its support SD. It is understood that the disk D may be any of the disks 101–112, 201–212, etc., of any of the systems shown in FIGS. 1–3. This disk is then provided with four feet $FO_1$–$FO_4$, ($FO_3$, $FO_4$ not shown) disposed on its lower part (see FIG. 12b), the first two of which are the only ones visible in FIG. 12b. The disk further includes a connector CN intended to be inserted into the associated connector of the associated electronic card. It can thus be said that each of the disks 101–112, 101–110 includes a connector $CN_{101}$–$CN_{112}$ (or $CN_{101}$–$CN_{110}$). These connectors, $CN_{101}$–$CN_{112}$, for example, are intended to be connected to the corresponding connector $C_{101}$–$C_{112}$ (or $C_{101}$–$C_{110}$) of the plate $P_1$. It is understood that each of the CN-type connectors is in accordance with the SCSI Standard. Turning to FIG. 12a, which shows the support of the disk SD, it is seen that this includes four shoulders $EP_1$, $EP_2$, $EP_3$, $EP_4$, disposed on each of the two longitudinal edges of the support, with two shoulders on each of the edges. Each of the two shoulders is associated with one foot of the disk intended to be inserted into the support. Hence the shoulder EP1 is associated with the foot $FO_1$, the shoulder $EP_2$ with the foot $FO_2$, etc. Each of these shoulders includes at its center a hole, by which a screw can be passed that is then inserted into the corresponding foot, thus enabling the fixation of the disk D to its support. For obvious reasons of simplicity, these screws are not shown in FIGS. 12a–12d. The front of the support SD, located in the right-hand portion of FIG. 12a, includes an opening 0, into which the connector CN is inserted when the disk D is mounted on the support. The front part of the disk DAV is, therefore, the part that comes into contact with the central part of the plate $P_1$. The rear part of the disk, here identified by the symbol DAR, has the form of an inverted L-shaped angle bracket, which makes it extremely easy to manually grasp the support for the manipulations thereof. DAR is located in the left part of FIG. 12a. The support SD, toward the rear part, includes a groove R whose axis is parallel to the longitudinal axis of the plate $P_1$ when the corresponding disk is mounted on the plate (the axis of R is accordingly perpendicular to the length of SD). This groove includes two parts, a part $R_1$ and a part $R_2$, the part $R_1$ having a rectangular shape terminated by a semicircle, with a width 1 (1 being measured parallel to the length of the support SD), and the part $R_2$, adjoining the part $R_1$, having a circular shape of diameter greater than 1. The functional utility of dividing the groove R into two parts will become more apparent in conjunction with the description of FIGS. 13–14b.

In FIG. 12c, the disk D mounted on its support is seen in perspective, with the foot $FO_1$ being screwed to the shoulder $EP_1$, the foot $FO_2$ to the shoulder $EP_2$, and the connector CN disposed inside the opening O. In addition, to facilitate the operations of manipulating the disk D mounted on its support, one can also see, in FIG. 12c, a handle PO, which is mounted by screwing it to the front portion DAR. This handle PO enables easy manual manipulation of the disk D when it is mounted on its support, for instance with a view to inserting it into the plate (such as $P_1$) where it is mounted. Turning to FIG. 12d, one can see the shoulder $EP_3$ and $EP_4$ onto which the handles $PO_3$ and $PO_4$ are screwed.

Figure 13:
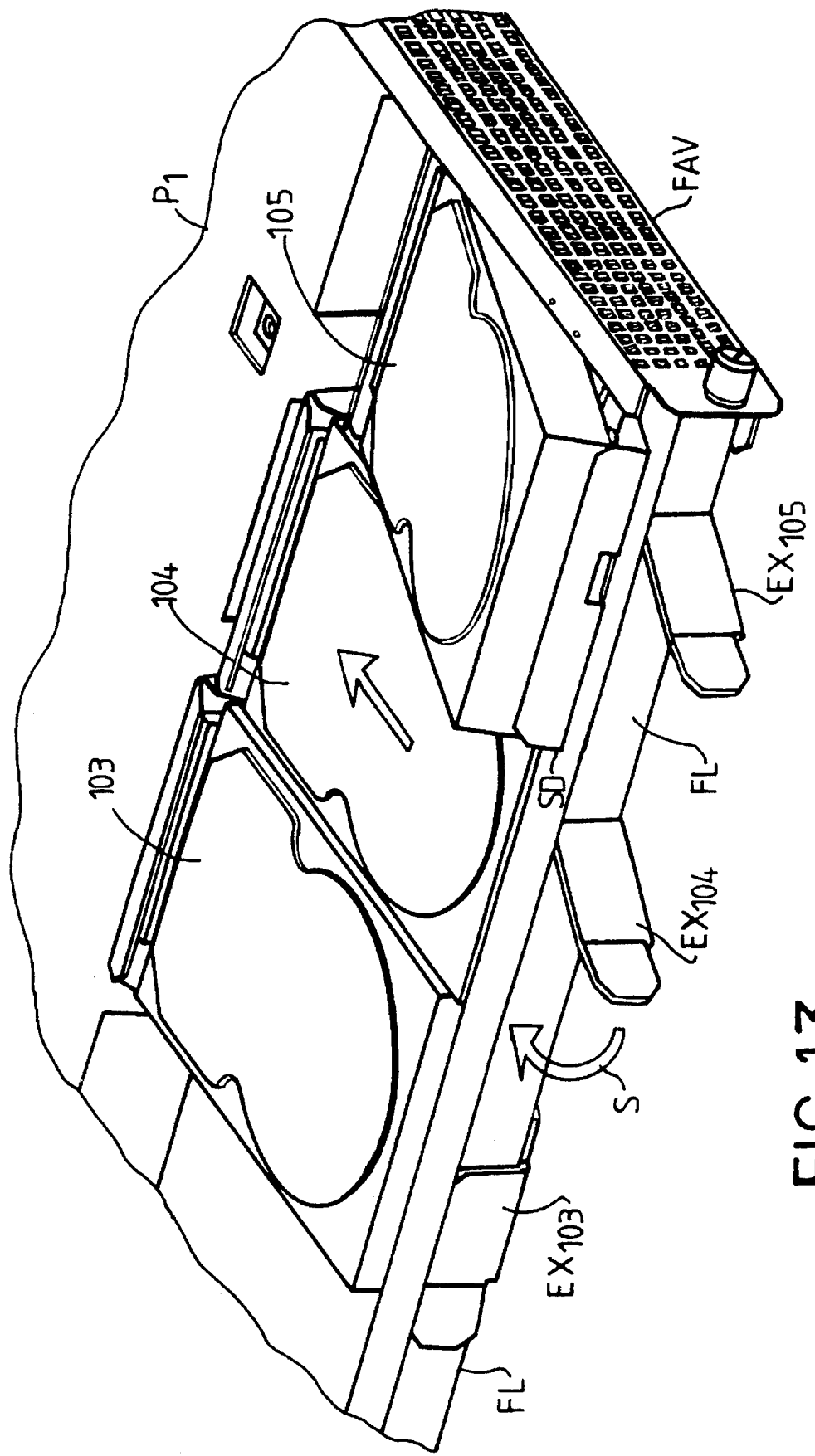
FIG. 13 shows how the disk units are inserted inside a plate and then connected to the adapter card belonging to the plate.
Figure 14:
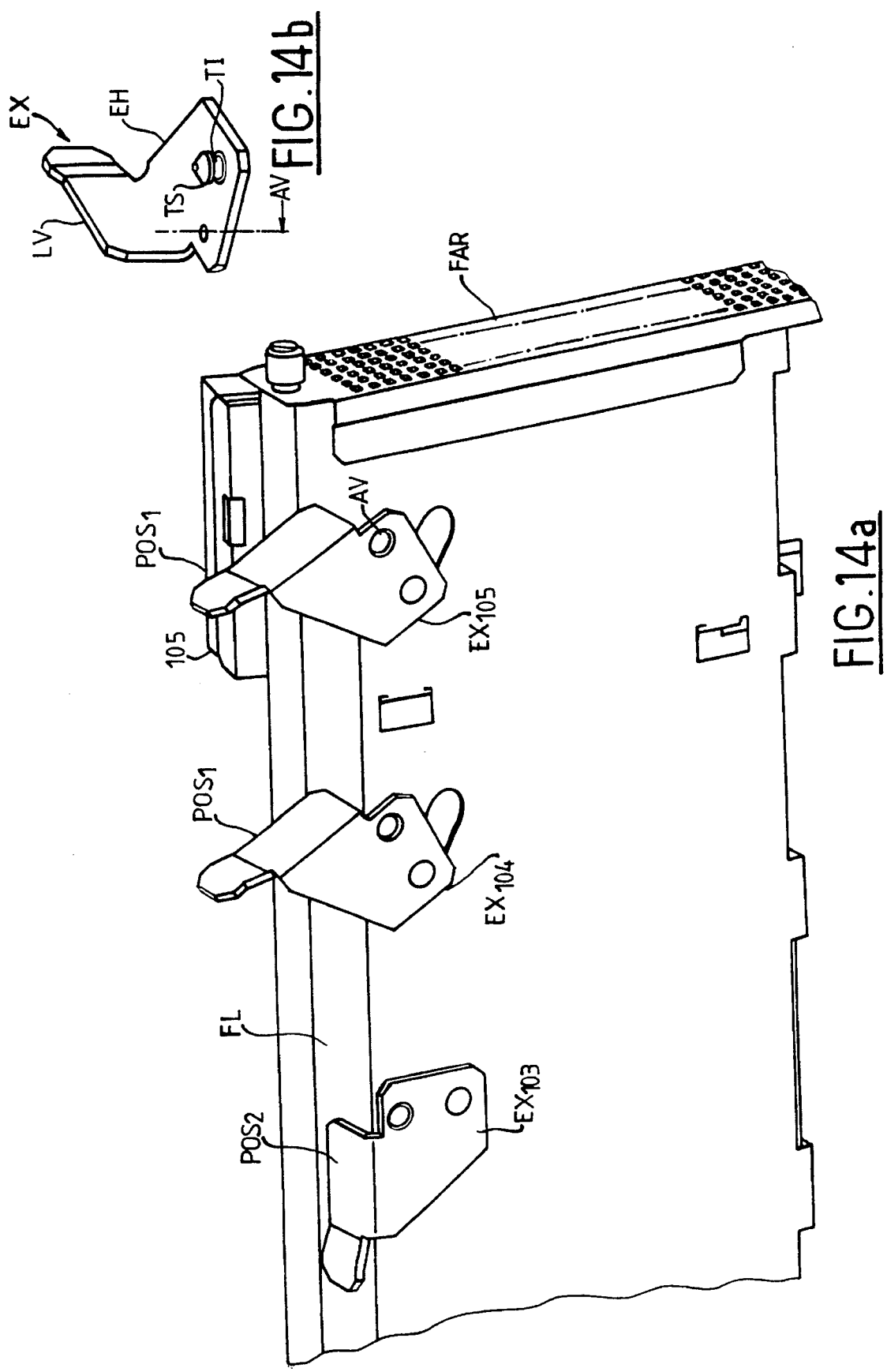
FIGS. 14a–14b show, in detail, the mechanism that makes it possible to insert a disk unit inside a plate.

The description now turns to FIGS. 13-14b.

In particular, in FIG. 14b one can seen in more detail, in a perspective view, any one of the removal levers here marked EX. This removal lever may be any one of the removal levers $EX_{105}$, $EX_{104}$, $EX_{103}$, etc. that are shown in FIGS. 14a and 13. In this same drawing figure, one may see that such a lever includes one part that may be considered vertical and is marked EV, and a horizontal part that is marked EH. When any of the disks is to be inserted into the plate $P_1$, this vertical part EV is the part that the operator manually manipulates. The horizontal part EH is mounted on the cap $CP_1$ of the plate $P_1$. It is mounted thereon in such a way as to be free to rotate about a vertical axis (axis AV in FIG. 14b). The removal lever EX also includes a dog point, fixed on its horizontal part EH and including an upper part TS and a lower cylindrical part TI. The latter has a diameter equal to the width l of the part R1 of the groove R (See FEB. 12a) into which it is to be inserted. In this way, the dog point can slide with this lower part parallel to the axis of this groove R. The upper part TS has a diameter that is slightly less than the diameter of the part $R_2$ of the groove R, in such a way as to be capable of being introduced into it.

Turning to FIG. 14a, the lever $EX_{105}$ is seen in the right-hand part in the removal position. In this position, indicated by the symbol $POS_1$, the part EV of the lever is detached from the lateral face FL of $P_1$. With this lateral face FL, this part EV forms a predetermined angle, which has been mentioned above as being on the order of 30°, but which is intentionally exaggerated in FIG. 14a for the sake of clarity in the drawing. In the center of the drawing figure, the lever $EX_{104}$ is seen in the same position $POS_1$. The difference between the right-hand part of the drawing and the central part is that in the right-hand part, the disk 105 has been shown in the preliminary position for insertion into the plate $P_1$. In the left-hand part of FIG. 14a, the lever $EX_{103}$ is shown in the insertion position, that is, $POS_2$, where the part EV of this lever is in contact with the lateral face FL of the plate $P_1$.

In order to introduce any disk into the inside of the plate $P_1$ as indicated in FIG. 13, the disk, for instance disk 105 (as visible in the right-hand part of FIG. 13), is inserted by its front part DAV in such a way that, being caused to slide toward the electronic card $CDA_1$, this front part comes into contact with the corresponding connector of the card, or in this case the connector $C_{105}$. During this phase of prepositioning and insertion into the plate $P_1$, the disk 105 is inclined relative to the plane of the plate $P_1$. When the connector $CN_{105}$ of the disk 105 comes into contact with the connector $C_{105}$, the disk can be pivoted downward in such a way that its support SD is located flat on the plate $P_1$. In that case, the disk occupies the position shown in the center of FIG. 13, the position occupied by the disk 104. The insertion removal lever $EX_{105}$ or $EX_{104}$ is still in the removal position $POS_1$. Once this disk is in position on the plate $P_1$ (as is the case for the disk 104), the dog point is disposed inside the groove R, and more precisely inside the part $R_2$ thereof. The lever $EX_{104}$ can then be shifted from the position $POS_1$ to the position $POS_2$, called the insertion position, by causing this lever to rotate about its hinge in the direction of the arrow S (see the central part of FIG. 13), in the manner of the hands of a clock. In the final position, the removal lever $EX_{103}$ enters the position $POS_2$, where its vertical part EV is in contact with the lateral face FL of the plate $P_1$. When the lever moves from $POS_1$ to $POS_2$, the dog point slides in the groove in such a way as to move from the part $R_2$ thereof to the part $R_1$, and more precisely to come into contact with the end thereof in the form of a semicircle (see also FIG. 12a). When the dog point abuts against this semicircular part, the disk (in this case 103) is locked and is connected to the corresponding connector $C_{103}$ (see the left-hand part of FIG. 13).

Figure 15:
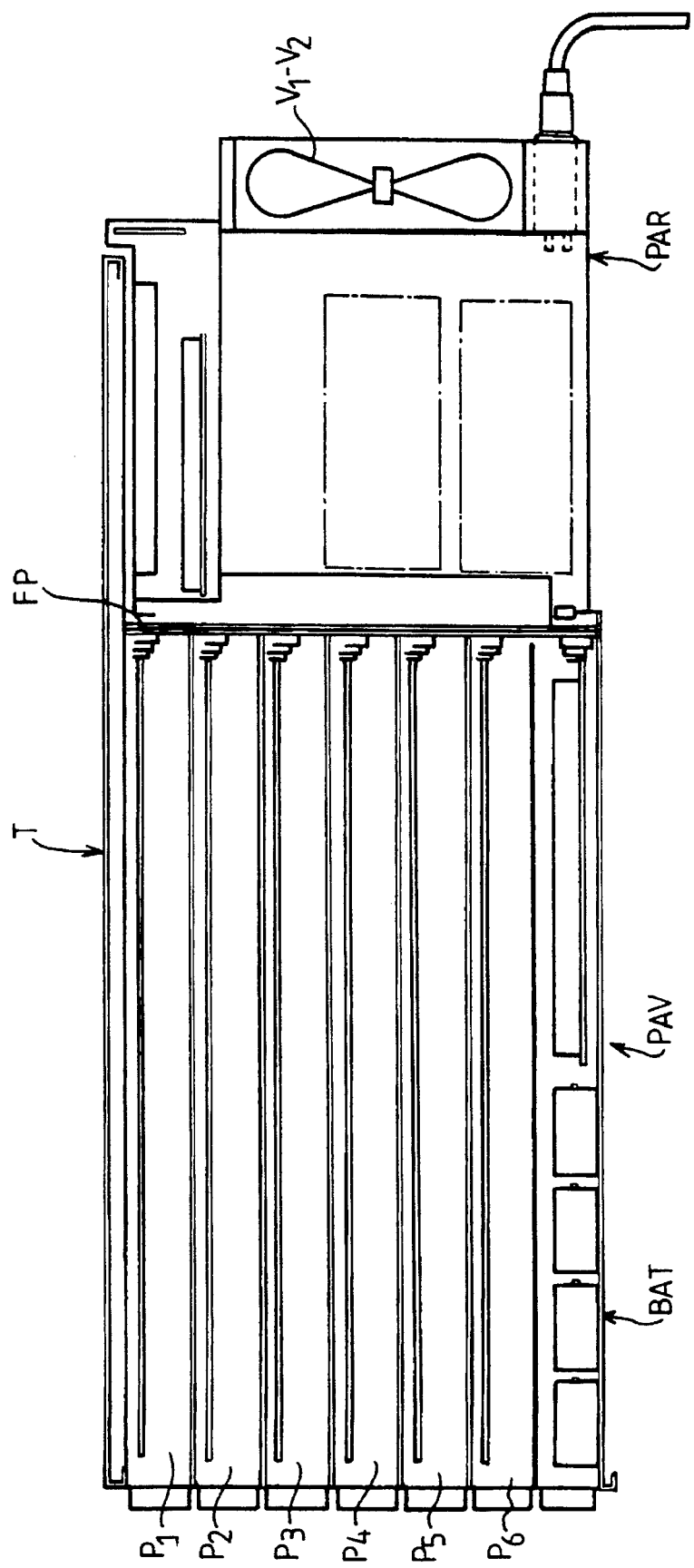
FIG. 15 is a side view in section showing the entire physical structure according to the invention, with its backpanel separating the front and rear portions.

The description now turns to FIG. 15.

The part PAV and the rear part PAR of the drawer T are separated by a back panel FP, which includes a plurality of connection means (which will be described in more detail in conjunction with FIG. 16), enabling the connection of each of the plates $P_1$ to the central hosts located outside the drawer T. The backpanel FP includes a plurality of connection links between the various plates, which make it possible to embody one or the other of the structures of mass memory subsystems $SSM_1$–$SSM_3$ that are shown in FIGS. 1–3. It thus suffices to change the backpanel FP in order to change from one of these structures to another, and this can be done without in any way changing the constitution of the plates $P_1$–$P_5$ or $P_6$. One can accordingly say that the drawer T, as designed, makes it possible to accommodate a great variety of mass memory subsystems, by allowing a change from one to the other easily, at the very location where the drawer T is disposed. This is called an "upgradable" system.

Figure 16:
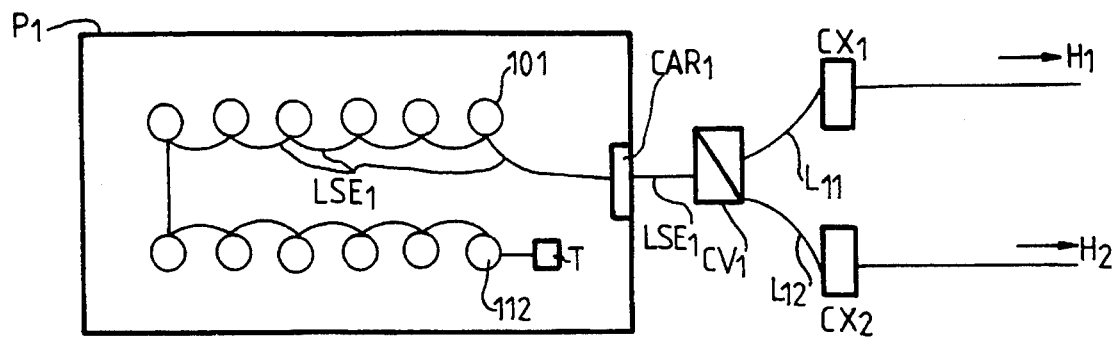
FIG. 16 shows how a plate is connected to at least one external host system.

Turning to FIG. 16, this shows how the plate $P_1$ is connected to two host systems $H_1$ and $H_2$. In this drawing figure, the disks 101–112 are shown, which are connected to one another by a standardized "single ended"-type SCSI link. This link is marked $LSE_1$ here. Outside the subsystem, the SCSI-type links are in the differential mode. It is accordingly appropriate to provide a converter $CV_1$ ($CV_2, \ldots, CV_6$) in the subsystem, for each plate, making it possible to assure the transition between the link in the "single ended" mode and the external links $LSE_1$ in the differential mode.

In FIG. 16, these links $L_{11}$ and $L_{12}$, enabling connection of the disks of $P_1$ by way of $CV_1$, on the one hand, to a connector $CX_1$ connected to a first central host H1, and on the other to a connector $CX_2$ that in turn is connected to a second central host H2, respectively. The connectors $CX_1$ and $CX_2$ are standardized, as are the links $L_{11}$ and $L_{12}$. $CV_1$ is connected to the plate $P_1$ by way of $LSE_1$ and the connector $CAR_1$. Turning to FIG. 15, one can see that the backpanel FP includes a plurality of connectors $CAR_1$, $CAR_2$, etc. Moreover, turning to FIG. 8, which shows the rear face FAR of the drawer T, one can see the two connectors $CX_1$ and $CX_2$ in the upper left part of this same drawing figure. The rear face FAR moreover includes all the connectors of the other plates $P_2$–$P_5$ or $P_6$. There is accordingly room for 12 connectors in FIG. 8.

Figure 17:
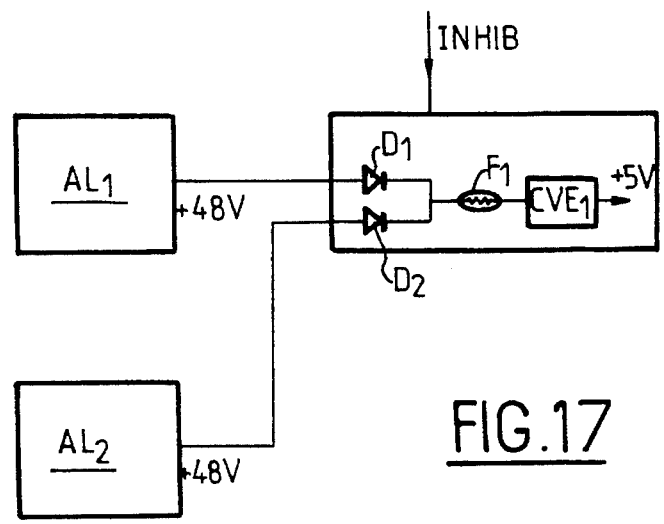
FIG. 17 shows the electrical power supply system of any one of the plates belonging to the physical structure of the invention.

Turning to FIG. 17, the highly simplified electrical power supply diagram for the various plates is shown. Thus, as has been noted above, the drawer T includes two identical power supplies $AL_1$ and $AL_2$, which for each plate of type $P_1$ are connected to two respective diodes $D_1$ and $D_2$, which in turn are connected to a fuse $F_1$ that in turn is connected to an electrical converter $CVE_1$. The two power supplies $AL_1$ furnish a direct voltage of 48 V, while the converter $CVE_1$ furnishes a voltage of +5 V. It accordingly assures the conversion from 48 to 5 V.

It will be appreciated that if an accident occurs, for example excess current or excess voltage, the fuse $F_1$ assures protection for the plate $P_1$. Since the same is true for each of the plates, it is see that only one among them can be affected by overvoltage or overintensity, while the others can continue to function. It accordingly suffices to change the fuse, such as $F_1$, of the plate in question, in order to return the plate effected by this accident to operation. Moreover, all the plates $P_1$–$P_6$ can be removed without having to cut the electrical power supply to the other plates, since the converter $CVE_1$ is equipped with an inhibition input INHIB controlled by a switch manipulated manually by the operator (this is true for each of the plates $P_1$–$P_6$) and located in the front part of the drawer T.

While the invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the spirit and scope of the invention as described herein and in the following claims.

We claim:

1. An apparatus (T) for housing a mass memory subsystem ($SSM_1$–$SSM_3$), said mass memory subsystem being connected to at least one host system ($H_1$, $H_2$), the apparatus comprising:

a housing;

a plurality of plates (P1–P6) slidably insertable within said housing and having a central portion about which a plurality of compartments are disposed, each compartment receiving and carrying at least one of a plurality of groups of disk units (101–112, 201–212, . . . , 601–612), said central portion comprising an electronic card to which said disk units are connected, said electronic card providing at least one of real-time management of disk units and connection of the disk units to said host system;

at least one electrical power supply ($AL_1$, $AL_2$) for supplying electrical power to said disk units;

said housing further including a front portion (PAV) adapted to house said plurality of plates, wherein said plurality of plates are slidably insertable into said front portion and are arranged parallel to each other;

a rear portion (PAR) housing said at least one electrical power supply; and a backpanel (FP) connected to each of the electronic cards of said plurality of plates by connection means (CAR, $CX_1$, $CX_2$) disposed in a predetermined configuration ($SSM_1$, $SSM_2$, $SSM_3$) on said backpanel, said predetermined configuration being based on a specific subsystem being housed in said apparatus.

2. The apparatus of claim 1, wherein said disk units are distributed in two rows inside each of the plates, said rows being parallel to each other, each row comprising a plurality of disk units side by side, wherein a longitudinal axis of the plate is perpendicular to a longitudinal axis of each disk unit.

3. The apparatus of claim 2, wherein each disk unit comprises first connection means disposed toward said electronic card and said electronic card comprises a corresponding connection means fixed in predetermined positions along the longitudinal sides of the electronic card for receiving said first connection means.

4. The apparatus of claim 3, wherein the rear portion further comprises ventilation means mounted inside said electrical power supply for providing ventilation of said power supply and said plurality of plates, each plate further comprising regularly spaced-apart ventilation holes disposed on a front edge and a rear edge of said plates, said ventilation holes enabling ventilating air to flow in a direction parallel to a length of each plate.

5. The apparatus of claim 4, wherein the ventilating air flows from a front of said plates to a rear of said plates.

6. The apparatus of claim 3, wherein each plate further comprises levers for removal and insertion of each disk unit of each row of disk units, said levers occupying one of a removal position and an insertion position, said levers being rotatable about a hinge mounted on a longitudinal edge of the plate and being perpendicular to the plane of the plate, said hinge enabling movement between said insertion position and said removal position, the disk unit associated with the lever being disconnected from said electronic card when said lever is in said removal position and being connected to said electronic card when said lever is in said insertion position.

7. The apparatus of claim 2, wherein the rear portion further comprises ventilation means mounted inside said electrical power supply for providing ventilation of said power supply and said plurality of plates, each plate further comprising regularly spaced-apart ventilation holes disposed on a front edge and a rear edge of said plates, said ventilation holes enabling ventilating air to flow in a direction parallel to a length of each plate.

8. The apparatus of claim 7, wherein the ventilating air flows from a front of said plates to a rear of said plates.

9. The apparatus of claim 2, wherein each plate further comprises levers for removal and insertion of each disk unit of each row of disk units, said levers occupying one of a removal position and an insertion position, said levers being rotatable about a hinge mounted on a longitudinal edge of the plate and being perpendicular to the plane of the plate, said hinge enabling movement between said insertion position and said removal position, the disk unit associated with the lever being disconnected from said electronic card when said lever is in said removal position and being connected to said electronic card when said lever is in said insertion position.

10. The apparatus of claim 9, wherein each disk unit is mounted on a support, said support comprising:

a plurality of shoulders adapted to receive a plurality of feet, said feet being attached at a first end to said disk unit and being attached at a second end to said shoulders; and an opening for receiving a connector, said connector being disposed on said disk unit.

11. The apparatus of claim 10, wherein the support further comprises a groove disposed toward a rear portion of said support, said groove being parallel to a longitudinal axis of the plate, said groove having a first portion and a second portion, said first and second portions being contiguous, said first portion having a substantially rectangular shape terminating in a semicircle of a predetermined width and said second portion having a circular shape having a diameter greater than said predetermined width.

12. The apparatus of claim 11, wherein the lever comprises a horizontal portion and a vertical portion, said vertical portion being manipulated manually and said horizontal portion including a dog point, said dog point being insertable in said groove wherein moving said dog point from said second portion of said groove to said first portion of said groove corresponds to moving said lever from said removal position to said insertion position, thereby inserting said disk unit into said plate.

\* \* \* \* \*